United States Patent
Saketi et al.

(10) Patent No.: US 10,930,529 B2
(45) Date of Patent: Feb. 23, 2021

(54) FORMATION OF ELASTOMERIC LAYER ON SELECTIVE REGIONS OF LIGHT EMITTING DEVICE

(71) Applicant: Facebook Technologies, LLC, Menlo Park, CA (US)

(72) Inventors: Pooya Saketi, Cork (IE); Patrick Joseph Hughes, Cork (IE); William Padraic Henry, Cork (IE); Joseph O'Keeffe, Bellevue, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/738,965

(22) Filed: Jan. 9, 2020

(65) Prior Publication Data

US 2020/0152492 A1    May 14, 2020

Related U.S. Application Data (63) Continuation of application No. 16/402,132, filed on May 2, 2019, now Pat. No. 10,566,220, which is a continuation of application No. 15/841,247, filed on Dec. 13, 2017, now Pat. No. 10,325,791.

(51) Int. Cl.
*H01L 21/67* (2006.01)
*H01L 33/10* (2010.01)
(Continued)

(52) U.S. Cl.
CPC ........ *H01L 21/67144* (2013.01); *B65G 47/90* (2013.01); *H01L 25/0753* (2013.01);
(Continued)

(58) Field of Classification Search
CPC ........... H01L 21/67144; H01L 25/0753; H01L 33/0095; H01L 33/10; H01L 33/20; H01L 27/1262; H01L 27/156; H01L 33/44
(Continued)

(56) References Cited

U.S. PATENT DOCUMENTS 7,518,149 B2    4/2009   Maaskant et al.
7,555,824 B2    7/2009   Chang et al.
(Continued)

FOREIGN PATENT DOCUMENTS

GB      2545155 A       6/2017
JP    2002/118125 A     4/2002
(Continued)

OTHER PUBLICATIONS

PCT International Search Report and Written Opinion, PCT Application No. PCT/US2018/065024, dated Apr. 9, 2019, 14 pages.
(Continued)

*Primary Examiner* — Thinh T Nguyen
(74) *Attorney, Agent, or Firm* — Fenwick & West LLP (57) ABSTRACT

A light emitting diode (LED) includes an elastomeric material that facilitates adhesive attachment with a pick-up head for pick and place operations. The LED includes an epitaxial layer defining a mesa structure and a light emitting surface. The mesa structure includes an active layer to emit light, and the emitted light is reflected at the mesa structure toward a light emitting region of the light emitting surface and transmitted at the light emitting region. An elastomeric material is on a portion of the light emitting surface, such as the light emitting region or a passive region. At the light emitting region, the elastomeric material may be shaped as a lens that collimates light transmitted from the light emitting region, and also facilitates adhesion to the pick-up head. At the passive region, the elastomeric material facilitates adhesion to the pick-up head without interfering with light emitted from the light emitting region.

20 Claims, 7 Drawing Sheets

(51) Int. Cl.
    *H01L 33/20*     (2010.01)
    *B65G 47/90*     (2006.01)
    *H01L 25/075*     (2006.01)
    *H01L 33/00*     (2010.01)
    *H01L 27/12*     (2006.01)
    *H01L 27/15*     (2006.01)
    *H01L 33/44*     (2010.01)
    *H01L 33/58*     (2010.01)

(52) U.S. Cl.
    CPC .......... *H01L 33/0095* (2013.01); *H01L 33/10* (2013.01); *H01L 33/20* (2013.01); *H01L 27/1262* (2013.01); *H01L 27/156* (2013.01); *H01L 33/44* (2013.01); *H01L 33/58* (2013.01)

(58) Field of Classification Search
    USPC ......... 438/22, 25, 26, 27, 29; 257/95, 98, 99
    See application file for complete search history.

(56) References Cited

U.S. PATENT DOCUMENTS

| | | |
|---|---|---|
| 2006/0038182 A1 | 2/2006 | Rogers et al. |
| 2006/0186429 A1 | 8/2006 | Chew |
| 2007/0176539 A1 | 8/2007 | Mathai et al. |
| 2008/0055581 A1 | 3/2008 | Rogers et al. |
| 2012/0261551 A1 | 10/2012 | Rogers |
| 2012/0320581 A1 | 12/2012 | Rogers et al. |
| 2014/0094878 A1 | 4/2014 | Gossler et al. |
| 2014/0220314 A1 | 8/2014 | Wu et al. |
| 2014/0267683 A1 | 9/2014 | Bibl et al. |
| 2016/0351764 A1 | 12/2016 | Cha et al. |
| 2017/0345692 A1 | 11/2017 | Liu et al. |
| 2018/0175248 A1* | 6/2018 | Ahmed ................... H01L 33/44 |
| 2018/0269234 A1 | 9/2018 | Hughes et al. |

FOREIGN PATENT DOCUMENTS

| | | |
|---|---|---|
| WO | WO 2008/143635 A1 | 11/2008 |
| WO | WO-2017/037475 A1 | 3/2017 |

OTHER PUBLICATIONS

European Patent Office, Extended European Search Report, European Patent Application No. 18888088.4, dated Dec. 14, 2020, 11 pages.

\* cited by examiner

FORMATION OF ELASTOMERIC LAYER ON SELECTIVE REGIONS OF LIGHT EMITTING DEVICE

CROSS REFERENCE TO RELATED APPLICATIONS

This application is a continuation of U.S. application Ser. No. 16/402,132, filed May 2, 2019, which is a continuation of U.S. application Ser. No. 15/841,247, filed Dec. 13, 2017, now U.S. Pat. No. 10,325,791, each of which is incorporated by reference in its entirety.

BACKGROUND

Electronic displays can be found in wearable electronic devices, smart phones, tablets, laptops, desktops, TVs and display systems. Some example display technologies include Inorganic Light Emitting Diode (ILED) displays and Organic Light Emitting Diode (OLED) displays. Micro-light emitting diodes (mLED) are small light emitting devices (e.g., having active regions of between 1 $\mu m^2$ and 20 $\mu m^2$) that can be used to form the sub-pixels of an electronic display. To manufacture the electronic display, mLEDs may be transferred from a carrier substrate to a target substrate that forms part of a display, or "display substrate." Because of the small size of the mLEDs, conventional pick and place techniques are unsuitable. Furthermore, the brightness of mLEDs can be limited by their small size, and thus the light extraction efficiency of such mLEDs is very low.

SUMMARY

A light emitting diode (LED) includes an epitaxial layer defining a mesa structure at a first side of the LED, a light emitting surface of the LED defined at a second side of the LED opposite the first side of the LED, and an elastomeric material is on the light emitting region of the light emitting surface. The epitaxial layer defines the mesa structure at the first side of the LED. The mesa structure includes an active layer to emit light. The light emitted from the active layer is reflected at the mesa structure toward a light emitting region of the light emitting surface and transmitted at the light emitting region. In some embodiments, the light from the active layer is collimated when reflected at the mesa structure, and the elastomeric material shaped as a lens collimates the light transmitted from the light emitting region.

In some embodiments, the LED includes a transparent (e.g., for the light emitted by the LED) substrate that defines the second side of the LED including the light emitting surface. The substrate may be attached with the epitaxial layer at a first side of the substrate, and a second side of the substrate opposite the first side includes the light emitting surface. The substrate may be a substrate on which the epitaxial layer is grown, such as a glass or sapphire substrate for gallium nitride (GaN) based epitaxial layer.

The elastomeric material may cover a portion of the light emitting surface, but not the entire light emitting surface. In some embodiments, the elastomeric material is on the light emitting region of the light emitting surface, and is shaped as a lens that collimates the light transmitted from the light emitting region. Here, the elastomeric material serves as an interface layer for adhesion with a pick-up head during pick and place of the LED from the carrier substrate to a display substrate, and also serves as an optical component that collimates light emitted from the light emitting region and improves light extraction efficiency. In other embodiments, the elastomeric material is formed on a passive region of the light emitting surface that is different from the light emitting region. Here, the elastomeric material may be used as an interface layer for adhesion with a pick-up head during pick and place of the LED, and does not interfere with the light emitted from the light emitting region.

Some embodiments include a method of manufacturing an electronic display. The method includes forming an elastomeric material on a portion of a light emitting surface of a light emitting diode (LED), picking up the LED by attaching the elastomeric material to a pick-up head, and placing the LED attached to the pick-up head via the elastomeric material on a display substrate of the electronic display. The elastomeric material formed on the light emitting region of the LED may be shaped as a lens that collimates the light transmitted from the light emitting region. In other embodiments, the elastomeric material is formed on the portion of the light emitting surface of the LED by at least one of a photolithography process, a micro-moulding process, a transfer-printing process In some configurations, the elastomeric material is formed on the portion of the light emitting surface of the LED by forming a mixture comprising the elastomeric material and a solvent, and dropping the formed mixture on the portion of the light emitting surface.

The figures and the following description relate to embodiments by way of illustration only. It should be noted that from the following discussion, alternative embodiments of the structures and methods disclosed herein will be readily recognized as viable alternatives that may be employed without departing from the principles disclosed herein.

DETAILED DESCRIPTION

A light emitting diode (LED) includes an epitaxial layer defining a mesa structure at a first side of the LED, and a light emitting surface of the LED with a transparent elastomeric layer formed as a lens that collimates light emitted by the LED in order to enhance the light extraction efficiency of the LED. The light emitting surface of the LED is defined at a second side of the LED opposite the first side of the LED. The mesa structure includes an active layer to emit light, and the light emitted from the active layer is reflected at the mesa structure toward the light emitting region of the light emitting surface and transmitted at the light emitting region. An elastomeric material covers a portion of the light emitting surface smaller than the (e.g., entire) light emitting surface to facilitate adhesion with a pick-up head for pick and place operations for the LED in the manufacturing of an electronic display. For example, the elastomeric material may be on a light emitting region of the light emitting surface. In some embodiments, the elastomeric material is shaped as a lens that collimates the light transmitted from the light emitting region. In other embodiments, the elastomeric material covers a passive region of the light emitting surface that does not emit light, and the elastomeric material at the passive regions does not interfere with the emitted light. Among other advantages, the elastomeric material that is formed on the LED to facilitate adhesive attachment with the pick-up head does not need to be removed from the light emitting surface because the elastomeric material enhances light extraction or is at a passive region that does not interfere with the emitted light.

Although the elastomeric material is discussed as being formed on LEDs, similar techniques may be applicable to vertical-cavity surface-emitting lasers (VCSELs) instead of the LEDs. For example, elastomeric material may be placed on a portion of a light emitting surface of a VCSEL to facilitate pick and place operations, or if the elastomeric material is shaped as a lens, to collimate light emitted from the VSCEL.

Example LED

Figure 1:
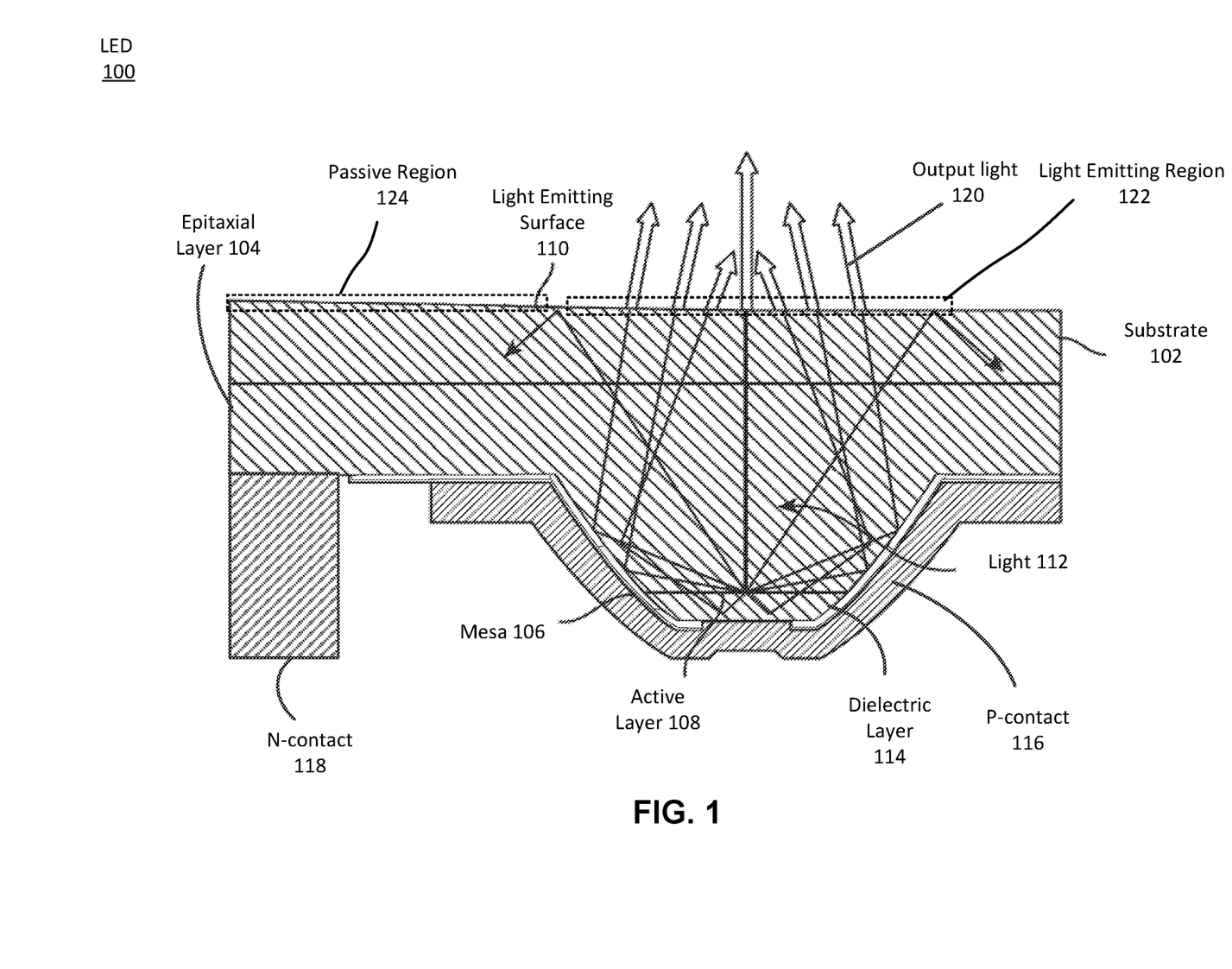
FIG. 1 is a cross sectional view of a light emitting diode (LED) including a growth substrate with a light emitting surface, in accordance with one embodiment.

FIG. 1 is a cross sectional view of a light emitting diode (LED) 100, in accordance with one embodiment. The LED 100 is an example of a microLED. A microLED (or "μLED" or "mLED") refers to a particular type of the LED 100 having a small active light emitting area (e.g., less than 2,000 μm$^2$, such as between 1 μm$^2$ and 400 μm$^2$), and may include collimated light output. The collimated light output increases the brightness level of light emitted from the small active light emitting area.

The LED 100 may include, among other components, a LED substrate 102 (or "substrate 102") with a semiconductor epitaxial layer 104 disposed on the substrate 102, a dielectric layer 114 disposed on the epitaxial layer 104, a p-contact 116 disposed on the dielectric layer 114, and an n-contact 118 disposed on the epitaxial layer 104. The light emitting surface 110 is a portion of the substrate 102 and the epitaxial layer 104 is disposed on the substrate 102. The light emitting surface 110 includes a light emitting region 122 that emits light, and one or more passive regions 124 that do not emit light (or emits small amounts of light, such as below a predefined intensity threshold). The passive region 124 and light emitting region 122 are each regions of the light emitting surface 110 smaller than the entire light emitting surface 110. The substrate 102 may be a growth substrate on which the epitaxial layer 104 is grown. In some embodiments, the substrate 102 is transparent for the light emitted by the LED 100, such as a sapphire or glass substrate for light emitted from a gallium nitride (GaN) based epitaxial layer 104.

Figure 2:
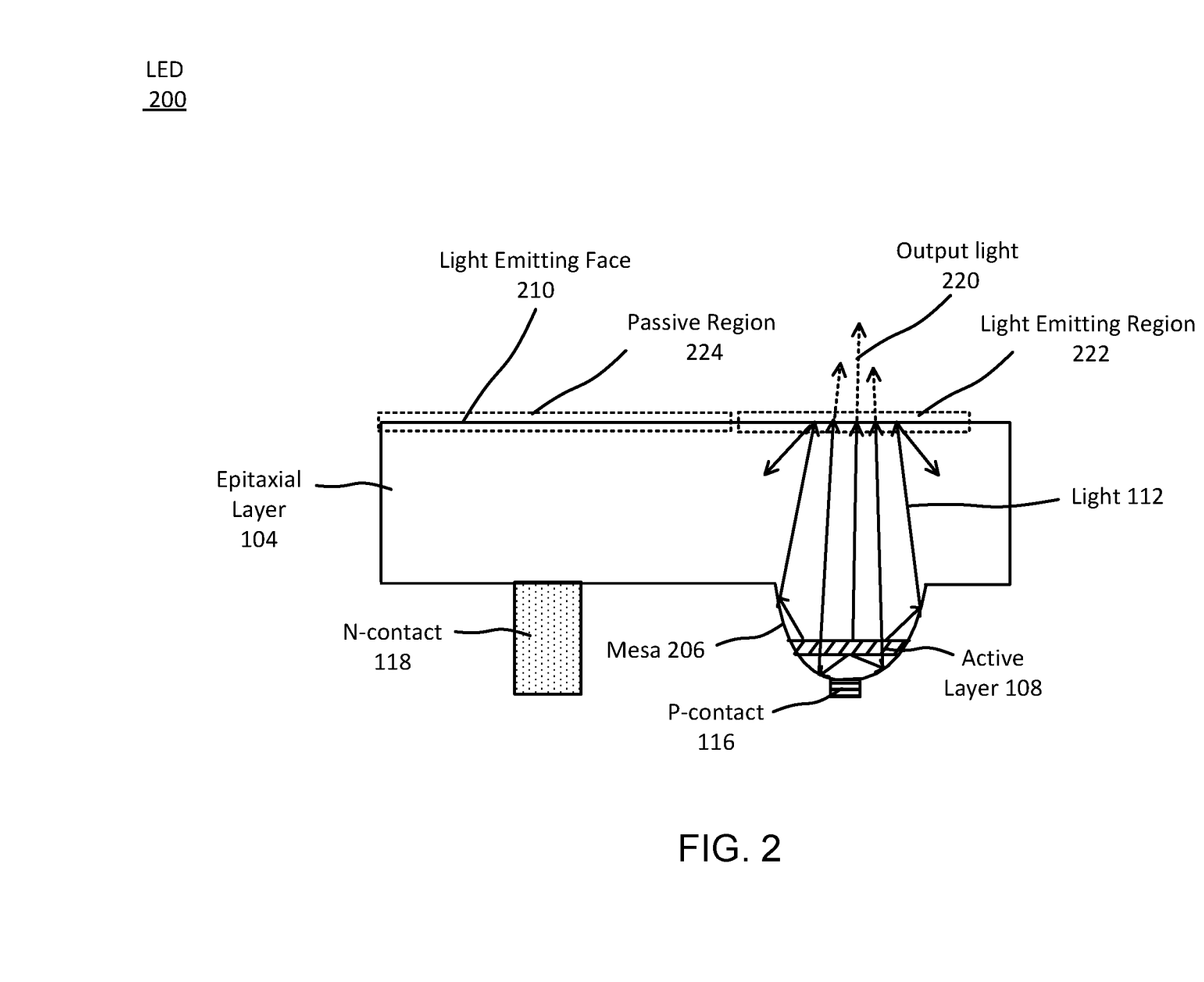
FIG. 2 is a cross sectional view of a LED including an epitaxial layer with a light emitting surface, in accordance with one embodiment.

In other embodiments, the light emitting surface 110 is a portion of the epitaxial layer 104 and the substrate 102 is omitted from the LED 100. For example, the substrate 102 may be separated from the epitaxial layer 104 using a laser lift off (LLO) process, exposing a light emitting surface on the epitaxial layer 104 as shown in FIG. 2. If the substrate 102 is a non-transparent substrate, such as a gallium arsenide (GaAs) substrate for light emitted from a GaAs based epitaxial layer 104, the substrate 102 may be removed. The type of materials used in the epitaxial layer 104 and substrate 102 may vary.

Returning to FIG. 1, the epitaxial layer 104 is shaped into a mesa 106. The shape of the mesa 106 results in an increase in the extraction efficiency of the LED 100 when compared to unshaped or standard LEDs. An active (or light emitting) layer 108 (or "active light emitting area") is included in the structure of the mesa 106. The mesa 106 has a truncated top, on a side opposed to a light emitting surface 110 of the LED 100. The mesa 106 also has a near-parabolic shape to form a reflective enclosure for light generated within the LED 100. The shape of the mesa 106 may be etched into the epitaxial layer 104 after the epitaxial layer 104 is grown on the substrate 102, and may be etched into various shapes that enhance light extraction efficiency. Although a parabolic mesa with truncated top is shown in FIG. 1, the mesa 106 may include other shapes such as a cylindrical shape with a truncated top or a conic shape with a truncated top. The arrows projecting from the active layer 108 show how light 112 emitted from the active layer 108 is reflected off the p-contact 116 and internal walls of the mesa 106 toward the light emitting region 122 of the light emitting surface 110 at an angle sufficient for the light to escape the LED 100 (i.e., within an angle of total internal reflection of the light emitting surface 110). The p-contact 116 and the n-contact 118 connect the LED 100 to a display substrate, in particular, the contact pads for a sub-pixel of the display substrate.

The LED 100 directionalizes the light output from the active light emitting area and increases the brightness level of the light output. The mesa 106 may be etched directly onto the LED die during the wafer processing steps to form a quasi-collimated light beam emerging from the light emitting surface 110.

As used herein, "directionalized light" includes collimated and quasi-collimated light. For example, directionalized light may be light that is emitted from a light generating region of a LED and at least a portion of the emitted light is directed into a beam having a half angle. This may increase the brightness of the LED in the direction of the beam of light. As such, the LED 100 produces light visible to the human eye with reduced current (e.g., nano-amps of drive current). Additional details regarding μLEDs, applicable in some embodiments, are discussed in U.S. Pat. No. 7,518,149, which is incorporated by reference herein in its entirety.

The techniques discussed herein, such as the use of a PPH to pick and place LEDs with elastomeric layers, is not limited to small semiconductor devices like μLED dies, and may also be applied to larger semiconductor devices with more relaxed spacing parameters.

FIG. 2 is a cross sectional view of a LED 200 with a light emitting surface, in accordance with one embodiment. The LED 200 is another example of a LED having a light emitting surface on which an elastomeric material may be formed to facilitate adhesion with a pick-up head. The LED 200 includes, among other components, a light emitting surface 210 on an epitaxial layer 104 which has been separated from a growth substrate.

The light emitting surface 210 includes a light emitting region 222 that emits light 112, and one or more passive regions 224 that do not emit light (or emits minimal light, such as below a predefined intensity threshold). The light 112 shows how light emitted from the active layer 108 is reflected off the p-contact 116 and internal walls of the mesa 106 toward the light emitting surface 210 at the light emitting region 222 of the light emitting surface 210 of the LED 200. Portions of the light 112 are incident at the light emitting region 222 at an angle sufficient for the light 112 to escape the LED 200 (i.e., within an angle of total internal reflection) as an output light 220.

The LED 200 directionalizes the light 112 output from the active layer 108 and increases the brightness level of the output light 220. In some embodiments, the LED 200 has a mesa 206 defining a parabolic structure (or a similar structure) etched directly onto the LED die during the wafer processing steps to form a quasi-collimated light beam emerging from the light emitting region 222 of the light emitting surface 210. The output light 220 includes collimated and quasi-collimated light, as discussed above for the LED 100 shown in FIG. 1.

Figure 3A:
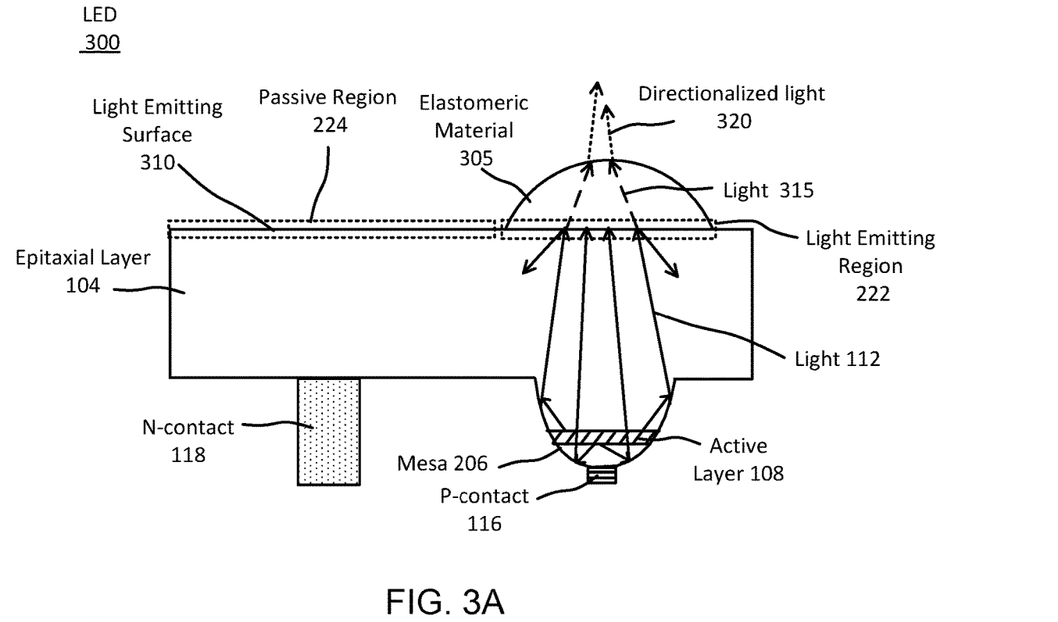
FIG. 3A is a cross sectional view of a LED with an elastomeric material shaped as a lens on a light emitting region of a light emitting surface, in accordance with one embodiment.

FIG. 3A is a cross sectional view of a LED 300 with an elastomeric material 305 shaped as a lens on a light emitting region 222 of a light emitting surface 310, in accordance with one embodiment. The LED 300 is an example of the LED 200 shown in FIG. 2, and further includes the elastomeric material 305 on the light emitting region 222 of the light emitting surface 310 of the epitaxial layer 104. The LED 300 includes, among other components, the elastomeric layer 305, and the light emitting surface 310 defined on the epitaxial layer 104. Similarly, the LED 100 shown in FIG. 1 may include an elastomeric material shaped as a lens on the light emitting region 122 of the light emitting surface 110 on the substrate 102.

The elastomeric layer 305 is a conformable layer disposed on the light emitting surface 310. The elastomeric layer 305 facilitates attachment of the LED 300 with pick-up surfaces of a PPH, including non-conformable pick-up surfaces. As described below in conjunction with FIGS. 5 and 6, the elastomeric layer 305 of each of the LEDs is configured to mount to the pick-up surfaces of the PPH to facilitate transfer of the LEDs from a carrier substrate to a display substrate. The elastomeric layer 305 may adhere with a non-conformable surface of the PPH. For example, the elastomeric layer 305 may be composed of Polydimethylsiloxane (PDMS), UV-curable PDMS, NuSil, etc. The elastomeric layer 305 is associated with characteristics including, but not restricted to, transparency to visible light spectrum, deposition by spin-coating, ability to micromould, ability to conform after curing, relatively higher thermal stability, etc.

In some embodiments, the elastomeric material 305 shaped like a lens is formed by mixing elastomeric material 305 with a solvent (e.g. cyclohexane, isobutyl methyl ketone), and dropping a controlled amount of the mixed liquid onto the light emitting region 222. The solvent may be evaporated, either in connection with a curing process or otherwise, to form the elastomeric material 305 shaped like a lens.

In some embodiments, the elastomeric layer 305 shaped like a lens is formed on the light emitting surface 310 using a photolithography process. The elastomeric material is mixed with a photoresist. The process further includes performing a preparation (e.g. cleaning, dehydration, etc.) on the light emitting surface 310, spinning the elastomeric material with the photoresist on the light emitting surface 310, and exposing a portion of the elastomeric material and the photoresist to a light. In the example of a positive photoresist material, the portion of the photoresist material 305 over the light emitting region 222 is blocked from the light and other portions of the photoresist material over the passive region 224 are exposed to the light, rendering the other portions soluble. The soluble portions of the photoresist material are then dissolved along with the elastomeric material on the passive regions 224, such as in a photoresist developer. As such, the elastomeric material 305 remains on the light emitting region 222. The elastomeric material 305 may be heated to cure the material. In some embodiments, an etching or other elastomeric material removal process may be used to shape the elastomeric material 305 into a desired shape of a lens that collimates the light transmitted from the light emitting surface 310. In one example, the elastomeric material 305 shaped like a lens is formed by making a partial area of the LED 300 hydrophilic and depositing an organic material by using at least one of a micro-needle matrix, a piezo dispenser, an inkjet printer, etc. In such configurations, the elastomeric material 305 is formed only on the partial area of the LED 300 with hydrophilic properties on the LED 300. In a different example, the elastomeric material 305 shaped like a lens is formed by making a master mould for partial moulding of the elastomeric material 305, filling the master mould with a diluted form of the elastomeric material 305, curing the elastomeric material 305, and de-moulding the elastomeric material 305.

The LED 300 directionalizes the light 112 output from the active layer 108 as shown, with portions emitted toward the mesa 206 being reflected and collimated at the mesa 206 and directed toward the light emitting region 222. The collimated light is directionalized, thus increasing the brightness level of the light 112 for a viewer facing the LED 300. Portions of the light 112 incident at the light emitting region 222 within a critical angle are transmitted through the light emitting region 222. The transmitted light 112 is further collimated by the elastomeric material 305 shaped like a lens, and output as directionalized light 320. Thus, portions of light emitted from the active layer 108 of the LED 300 are collimated both at the mesa 206, and further at the elastomeric material 305 shaped as a lens. The elastomeric material 305 is associated with optical properties including, but not restricted to, transparency to visible light, tunable refractive index, temporal stability (about 30,000 hours) at below 80° C., etc.

Figure 3B:
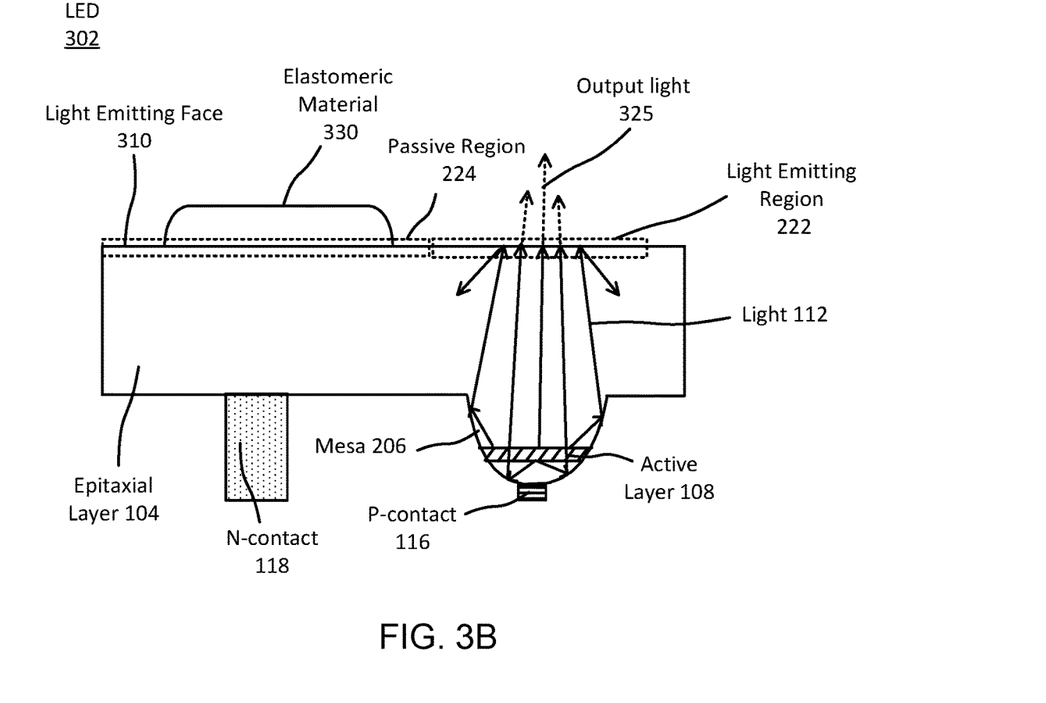
FIG. 3B is a cross sectional view of a LED with an elastomeric material on a passive region of a light emitting surface, in accordance with one embodiment.

FIG. 3B is a cross sectional view of a light emitting device (LED) 302 with an elastomeric material 330 on a passive region of a light emitting surface, in accordance with one embodiment. The LED 302 is an embodiment of the LED 200 shown in FIG. 2, and further includes the elastomeric material 330 on the passive region 224 of the light emitting surface 310 of the epitaxial layer 104. The light emitting surface 310 may include one or more passive regions that are different from the light emitting region 222 through which the LED 302 outputs the output light 325.

The elastomeric material 330 on the passive region 224 does not interfere with the output light 325. Nonetheless, the elastomeric material 330 provides a conformable interface layer for attachment of the LED 302 with a PPH during the assembly of the LED on a display substrate, as described below with reference to FIGS. 5-7. The elastomeric material 330 may be shaped like a flat surface layer, a lens, or some other shape. Furthermore, an opaque elastomeric material 330 for the emitted light may be used.

Figure 4:
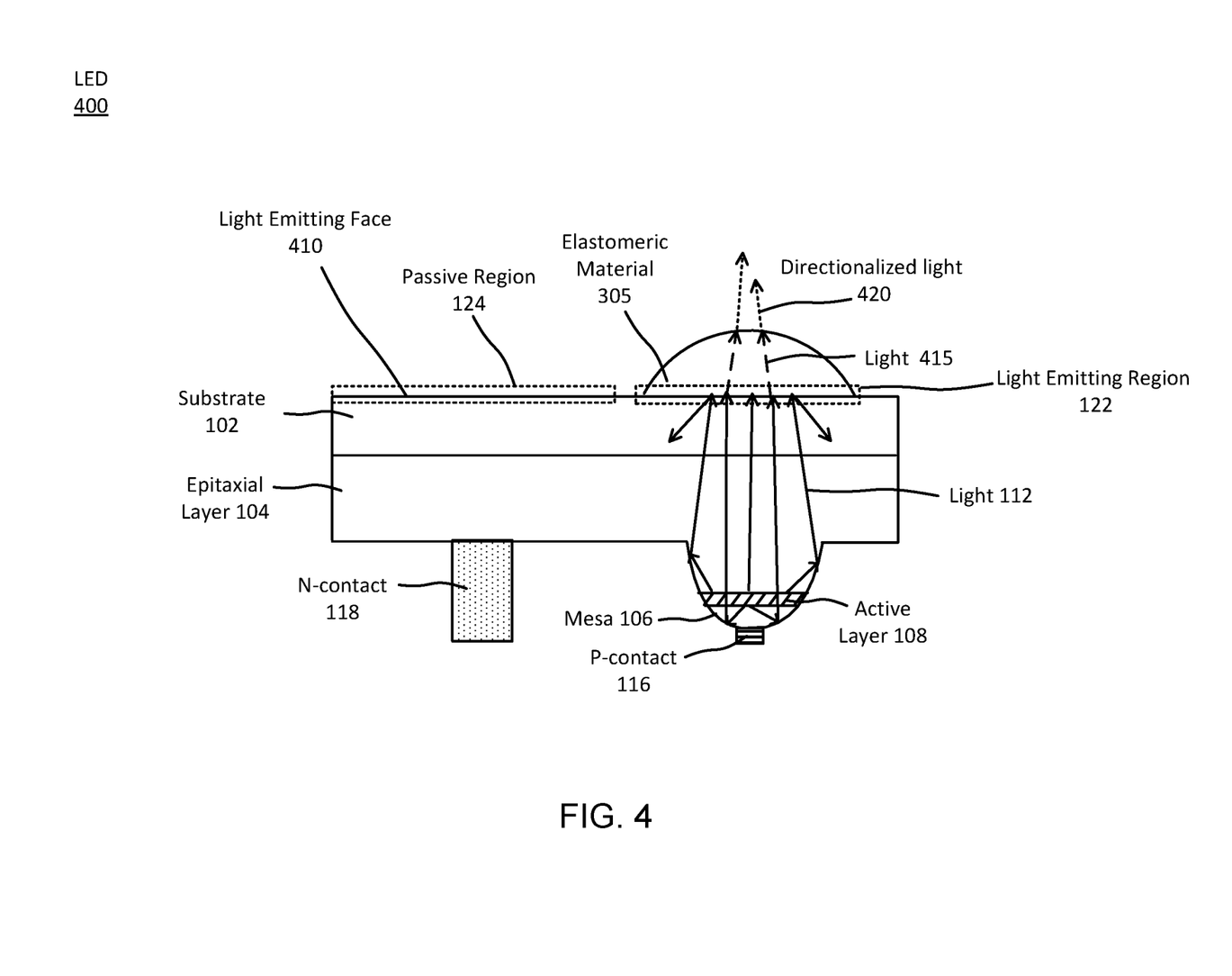
FIG. 4 is a cross sectional view of a LED with an elastomeric material shaped as a lens to collimate light transmitted from a light emitting surface of a substrate, in accordance with one embodiment.

FIG. 4 is a cross sectional view of a LED 400 with an elastomeric material 305 shaped as a lens to collimate light transmitted from a light emitting surface 410 of a substrate 102, in accordance with one embodiment. The LED 400 is an example of the LED 100 of FIG. 1, and further includes the elastomeric material 305 shaped as a lens on the light emitting region 122 of the light emitting surface 410 of the substrate 102. The light emitting surface 410 is a portion of the substrate 102, and the epitaxial layer 104 is disposed on the substrate 102. The epitaxial layer 104 may be grown on the substrate 102, and the substrate 102 may be a transparent substrate for the light emitted from the active layer 108.

The LED 400 directionalizes the light 112 output from the active layer 108 as shown, with portions emitted toward the mesa 206 being reflected and collimated at the mesa 206 and directed toward the light emitting region 222. The collimated light is directionalized, thus increasing the brightness level of the light 112 for a viewer facing the LED 400. Portions of the light 112 incident at the light emitting region 122 within a critical angle are transmitted through the light emitting region 122. The transmitted light 112 is further collimated by the elastomeric material 305 shaped like a lens, and output as directionalized light 420. Thus, portions of light emitted from the active layer 108 of the LED 400 are collimated both at the mesa 106, and further at the elastomeric material 305 shaped as a lens.

LED Pick and Place Process

Figure 5:
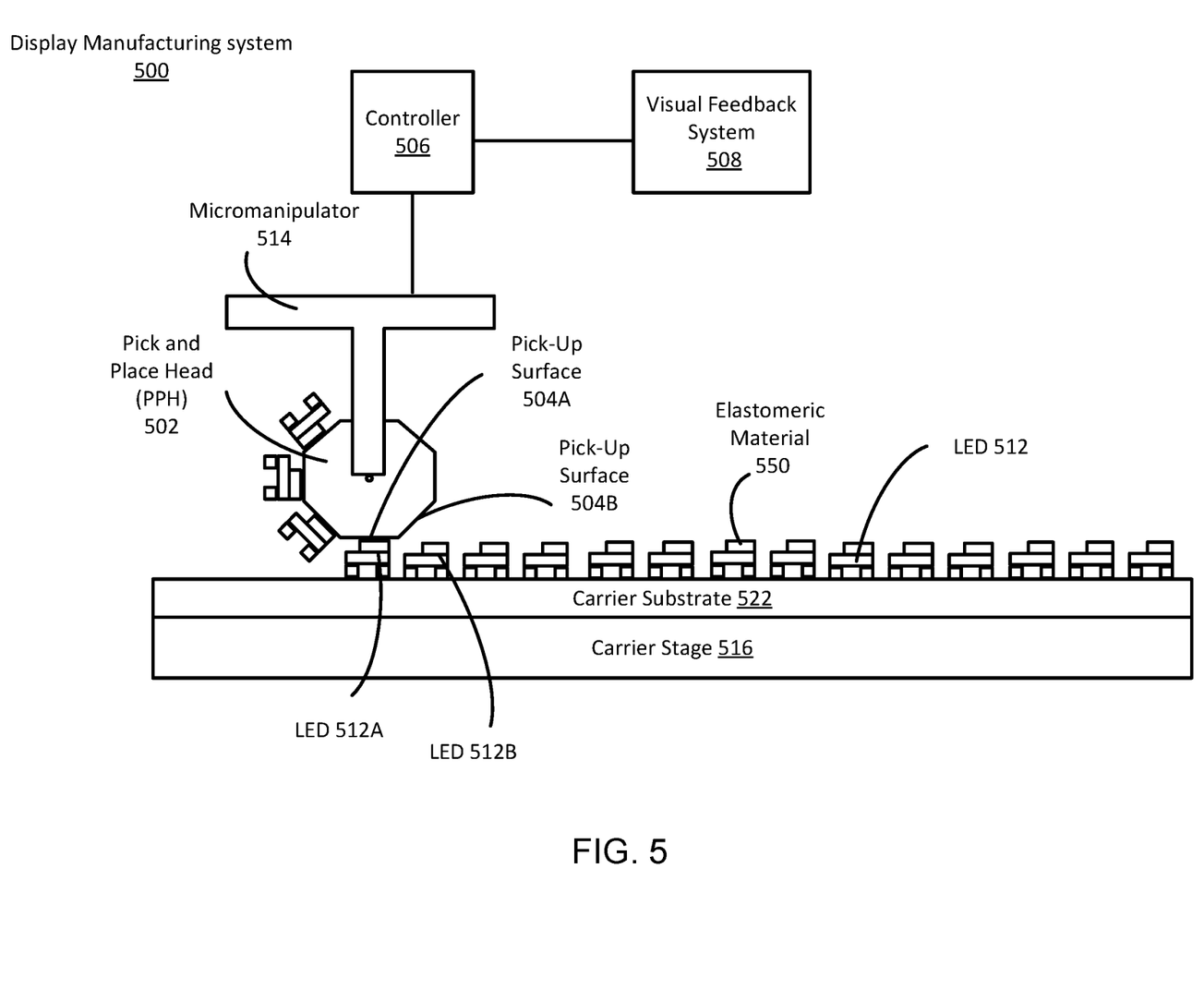
FIG. 5 is a schematic diagram illustrating picking up of LEDs using a pick and place head (PPH) in a display manufacturing system, in accordance with one embodiment.

FIG. 5 is a schematic diagram illustrating picking up of LEDs using a PPH in a display manufacturing system 500, in accordance with one embodiment. The manufacturing system 500 includes, among other components, a PPH 502, a controller 506, a visual feedback system 508, one or more LEDs 512, a micromanipulator 514, a carrier stage 516, and a carrier substrate 522. The LEDs 512 each include an elastomeric material 550 on a portion of the light emitting surface. The elastomeric material 550 may be elastomeric material 305 shaped as a lens and on the light emitting regions, or may be elastomeric material 330 on the passive regions. Although the LEDs are discussed herein using a PPH as a pick-up head, other types of pick-up heads capable of utilizing adhesion forces with the elastomeric material 550 may also be used.

The visual feedback system 508 generates an image of the PPH 502 and the LEDs 512 on the carrier substrate 522, and provides the image to the controller 506. Based on the image indicating the relative positions of the PPH 502 and LEDs 512 on the carrier substrate 522, the controller 506 sends a control signal to the micromanipulator 514 to move the PPH 502.

The PPH 502 is aligned with the carrier substrate 522 such that a pick-up surface 504A is aligned with an array of LEDs 512. Furthermore, the alignment is such that the PPH 502 can be rotated in a line along the arrays of LEDs 512 to pick up the arrays of LEDs 512 on multiple pick-up surfaces 504.

In some embodiments, aligning the PPH 502 may include moving the PPH 502 along multiple degrees of freedom, such as along six degrees of freedom, to position the PPH 502 over the carrier substrate 522 in proper alignment. In some embodiments, aligning the PPH 502 and the carrier substrate 522 may include adjusting position of the carrier substrate 522. For example, the controller 506 may control the carrier stage 516, and adjust the position of the carrier stage 516 along one or more degrees of freedom.

The PPH 502 is moved toward one or more LEDs 512 with the elastomeric material 550 on the carrier substrate 522 to pick up one or more LEDs with a first pick-up surface 514A of the PPH 502. For example, subsequent to the alignment, the PPH 502 is lowered toward the LEDs 512 to pick up the LEDs 512 with the pick-up surface 504A.

Subsequent to the PPH 502 picking up the one or more LEDs 512 with the first pick-up surface 514A, the PPH 502 is rotated to pick up one or more second LEDs 512 with a second pick-up surface 504B of the PPH 502. The second pick-up surface 514B may be adjacent to the first pick-up surface 504A as shown in FIG. 5, or may be a non-adjacent pick-up surface to the first pick-up surface 504A.

Example Placement Process

Figure 6:
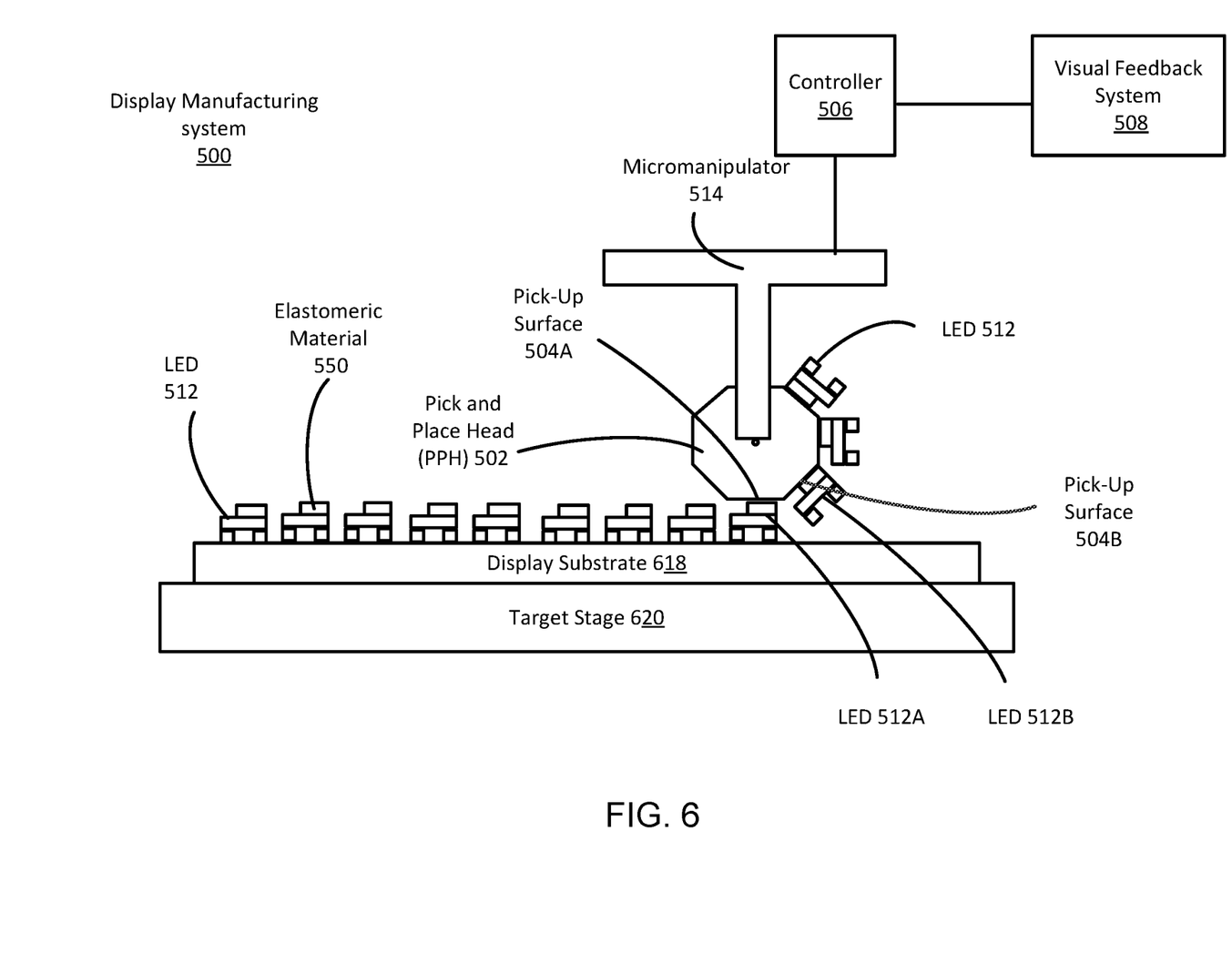
FIG. 6 is a schematic diagram illustrating placement of LEDs using a PPH in a display manufacturing system, in accordance with one embodiment.

FIG. 6 is a schematic diagram illustrating placement of LEDs using the PPH in the display manufacturing system 500, in accordance with one embodiment. The display manufacturing system 500 includes the PPH 502, one or more LEDs 512, the micromanipulator 514, the controller 506, the visual feedback system 508, a target stage 620, and a display substrate 618.

The visual feedback system 508 generates an image of the PPH 502 attached with LEDs 512 and the display substrate 618, and provides the image to the controller 506. Based on the image indicating the relative positions of the PPH 502 with LEDs 512 and the display substrate 618, the controller 506 sends a control signal to the micromanipulator 514 to move the PPH 502.

The micromanipulator 514 that controls the PPH 502 during placement of the LEDs may be the same micromanipulator that controls the PPH 502 during pick up of the LEDs, or may be a different micromanipulator that receives the PPH 502 attached with the LEDs. The PPH 502 is aligned with the display substrate 618 such that the pick-up surface 504A including an array of LEDs 512 along the length of the pick-up surface 504A is aligned with corresponding die placement locations for the LEDs 512 on the display substrate 618. Furthermore, the alignment is such that the PPH 502 can be rotated in a line along the display substrate 618 to place the LEDs 512 on multiple pick-up surfaces 504 of the PPH 502 on the display substrate 618.

The PPH 502 is moved with the one or more LEDs 512 attached to the pick-up surface 504A of the PPH 502 toward the display substrate 618 to place the one or more LED 512 on the display substrate 618. For example, subsequent to the alignment, the PPH 502 is lowered toward the display substrate 618 to place the LEDs 512 on the display substrate 618.

Subsequent to the PPH 502 placing the one or more LEDs 512 attached with the first pick-up surface 504A on the display substrate 618, the PPH 502 is rotated to place one or more LEDs 512 attached to the second pick-up surface 604B of the PPH 502 on the display substrate 618. The second pick-up surface 604B may be adjacent to the first pick-up surface 604A as shown in FIG. 6, or may be a non-adjacent pick-up surface to the first pick-up surface 604A.

After the display substrate 618 has been populated with LEDs from the PPH 502, the PPH 502 is moved away from the display substrate 618. For example, the PPH 502 may be lifted away from the display substrate 618 for a subsequent pick up of LEDs from the carrier substrate 522 and a placement of the picked up LEDs on the display substrate 618, and so forth.

Figure 7:
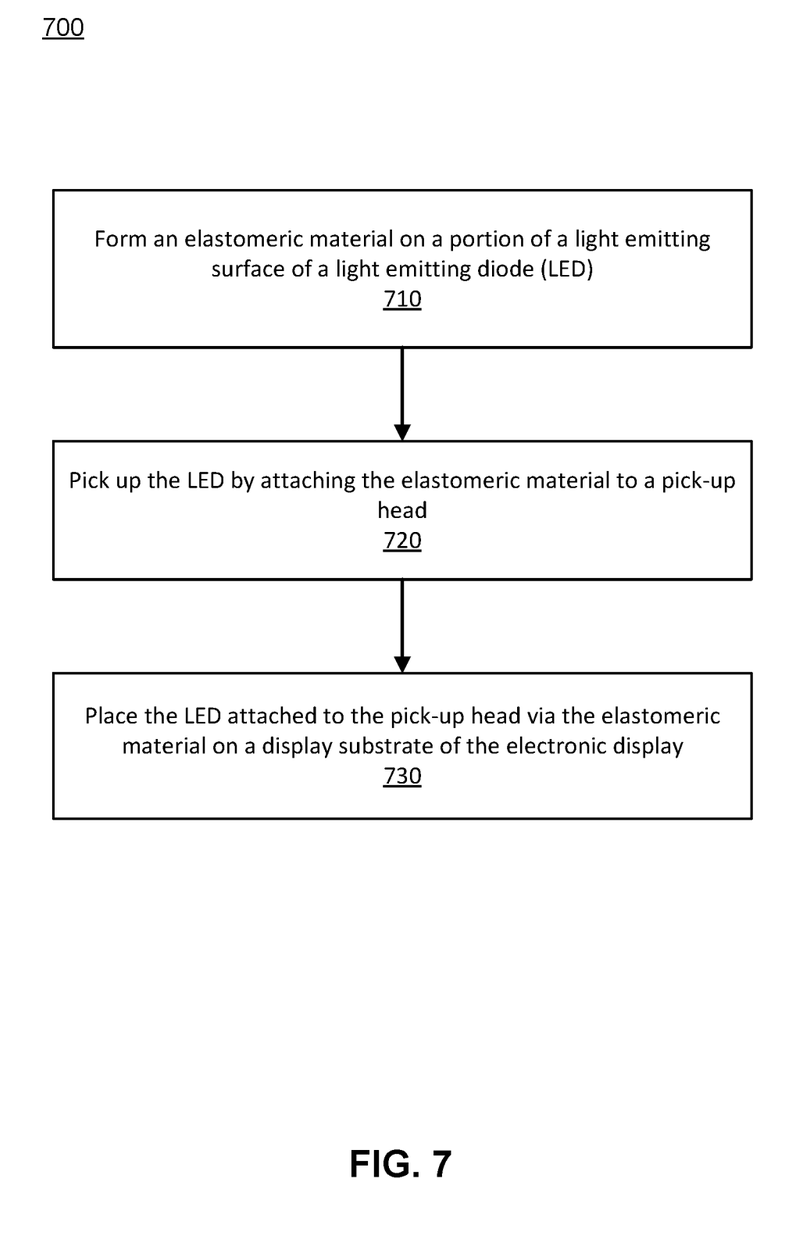
FIG. 7 is a flowchart illustrating a process for picking and placing LEDs via the elastomeric material on the LEDs using a PPH in the display manufacturing system, in accordance with one embodiment.

FIG. 7 is a flowchart illustrating a process 700 for picking and placing LEDs via the elastomeric material on the LEDs using a PPH 502 of the display manufacturing system 500, in accordance with one embodiment. The process 700 is discussed as being performed by the PPH 502, but other types of pick-up heads capable of adhesive attachment with elastomeric material formed on a portion of the light emitting surfaces of the LEDs may be used.

An elastomeric material is formed 710 on a portion of a light emitting surface of a LED. The elastomeric material may be the elastomeric material 305 shaped as a lens and formed on the light emitting region of the light emitting surface, or may be an elastomeric material 330 formed on a passive region of the light emitting surface.

A pick-up head, such as the PPH 502 of the display manufacturing system 500, picks up 720 the LED by attaching with the elastomeric material on the portion of the light emitting surface.

The pick-up head places 730 the LED attached to the pick-up head via the elastomeric material on a display substrate 618 of the electronic display. Each LED may form a sub-pixel of the electronic display. The display substrate 618 may include contact pads that interface with the n-contact and p-contact of the LED. The LED may be bonded and electrically connected with the display substrate using a thermo-compression bonding process or a laser bonding process. The display substrate 618 may include control circuits and control lines (e.g., data and gate signal lines) that drive the LEDs connected to each control circuit.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A method comprising:
    forming an elastomeric material on a light emitting region of a light emitting diode (LED), the elastomeric material shaped as a lens that collimates the light transmitted from the light emitting region;
    picking up the LED by attaching the elastomeric material to a pick-up head; and
    placing the LED attached to the pick-up head via the elastomeric material on a display substrate of an electronic display.

2. The method of claim 1, wherein the elastomeric material adheres with a non-conformable surface of the pick-up head.

3. The method of claim 1, wherein the elastomeric material is formed on the light emitting region of the LED by a photolithography process.

4. The method of claim 3, wherein the photolithography process includes:
    mixing the elastomeric material with a photoresist;
    preparing the light emitting surface;
    spinning the elastomeric material with the photoresist on the light emitting region; and
    exposing a portion of the elastomeric material and the photoresist to a light.

5. The method of claim 1, wherein the elastomeric material is formed on the light emitting region of the LED by a micro-moulding process.

6. The method of claim 1, wherein the elastomeric material is formed on the light emitting region of the LED by a transfer-printing process.

7. The method of claim 1, wherein the elastomeric material is formed on the light emitting region of the LED by forming a mixture comprising the elastomeric material and a solvent.

8. The method of claim 7, wherein the solvent includes one of cyclohexane or isobutyl methyl ketone.

9. The method of claim 7, further comprising dropping the mixture on the light emitting region with hydrophilic properties.

10. The method of claim 9, further comprising evaporating the solvent subsequent to dropping the mixture on the light emitting region.

11. The method of claim 9, further comprising curing the elastomeric material subsequent to dropping the mixture on the light emitting region.

12. The method of claim 1, wherein the LED includes an epitaxial layer defining a mesa structure at a first side of the LED, the mesa structure including an active layer to emit light.

13. The method of claim 12, wherein the epitaxial layer defines a second side of the LED including the light emitting region, the second side of the LED opposite the first side of the LED.

14. The method of claim 13, wherein the LED further comprises a substrate that is transparent for the light, the epitaxial layer on a first side of the substrate, a second side of the substrate defining the second side of the LED including the light emitting region.

15. The method of claim 1, wherein the LED is a micro-LED.

16. The method of claim 1, wherein the light emitting region is less than 400 $\mu m^2$.

17. The method of claim 1, wherein the elastomeric material includes Polydimethylsiloxane (PDMS).

18. The method of claim 1, further comprising etching the elastomeric material to form the lens.

19. The method of claim 1, micro-needle matrix, a piezo dispenser, an inkjet printer.

20. The method of claim 1, wherein the elastomeric material is formed on a portion of a light emitting surface of the LED, the light emitting surface including the light emitting region.

* * * * *